US006605856B2

(12) United States Patent
Ueda et al.

(10) Patent No.: US 6,605,856 B2

(45) Date of Patent: Aug. 12, 2003

(54) THERMISTER CHIPS

(75) Inventors: Yukiko Ueda, Shiga (JP); Masahiko Kawase, Shiga (JP); Norimitsu Kitoh, Shiga (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/232,437

(22) Filed: Aug. 29, 2002

(65) Prior Publication Data

US 2003/0001261 A1 Jan. 2, 2003

Related U.S. Application Data

(62) Division of application No. 09/521,584, filed on Mar. 9, 2000, which is a division of application No. 09/248,366, filed on Feb. 8, 1999, now Pat. No. 6,078,250.

(30) Foreign Application Priority Data

Feb. 10, 1998 (JP) .......................................... 10-028574
Apr. 3, 1998 (JP) .......................................... 10-091791

(51) Int. Cl.[7] ............................................... H01L 29/00
(52) U.S. Cl. ........................ 257/516; 257/536; 438/238
(58) Field of Search ................................ 257/516, 536, 257/541, 542, 543; 438/238, 385; 388/22 R, 313, 20

(56) References Cited

U.S. PATENT DOCUMENTS 5,245,309 A * 9/1993 Kawase et al. ........... 338/22 R
5,561,587 A * 10/1996 Sanada .................... 361/306.1
6,008,717 A * 12/1999 Kawase et al. ........... 338/22 R

* cited by examiner

*Primary Examiner*—Phat X. Cao
*Assistant Examiner*—Theresa T. Doan
(74) *Attorney, Agent, or Firm*—Beyer Weaver & Thomas LLP

(57) ABSTRACT

A resistor element has a ceramic body with a first outer electrode and a second outer electrode formed on its mutually opposite externally facing end surfaces and a plurality of mutually oppositely facing pairs of inner electrodes inside the ceramic body. Each of these pairs has a first inner electrode extending horizontally from the first outer electrode and a second inner electrode extending horizontally from the second outer electrode towards the first outer electrode and having a front end opposite and separated from the first inner electrode by a gap of a specified width, these plurality of pairs forming layers in a vertical direction. The gap of at least one of these plurality of pairs of inner electrodes is horizontally displaced from but overlapping with the gaps between the other pairs of inner electrodes. For producing such a resistor element, the distance of displacement is set according to a given target resistance value intended to be had by the resistor element. Alternatively, the thickness of those portions of the ceramic body between at least one of mutually adjacent pairs of the inner electrodes is different from the thickness of the portions of the ceramic body between the other mutually adjacent pairs of the inner electrodes.

2 Claims, 6 Drawing Sheets

THERMISTER CHIPS

This is a divisional of patent application Ser. No. 09/521,584 filed Mar. 9, 2000, now pending, which is a divisional of patent application Ser. No. 09/248,366 filed Feb. 8, 1999, now U.S. Pat. No. 6,078,250.

BACKGROUND OF THE INVENTION

This invention relates to resistor elements of a layered structure which may be used as a chip-type thermistor or a chip-type resistor element. More particularly, this invention relates to such resistor elements having mutually oppositely facing pairs of inner electrodes inside a resistor base body.

It has been known to use chip-type thermistor elements as a temperature-sensitive element or an element for temperature compensation. Elements of this type having different resistance values are frequently required, depending on where they are used. In response to such a requirement, chip-type thermistor elements of different structures have been proposed. Japanese Utility Model Publication Jikkai 6-34201 and Japanese Patent Publication Tokkai 4-130702 have disclosed various kinds of chip-type thermistor elements using a sintered ceramic body obtained by sintering together a ceramic material with inner electrodes.

FIGS. 10 and 11 show, as an illustration, the structure of a prior art thermistor element 151 of such a layered structure having a sintered ceramic base body 152 comprising a semiconductor ceramic material with a negative temperature coefficient. Mutually opposite end surfaces of this sintered ceramic body are referred to, for convenience, as the first end surface 152*a* and the second end surface 152*b* Outer electrodes 159 and 160 are formed so as to cover the first and second end surfaces 152*a* and 153*b*, respectively. A set of horizontally extending inner electrodes (referred to as the first electrodes) 153, 154 and 155 are formed at different heights inside the sintered ceramic body 152 so as to be exposed to the exterior on the first end surface 152*a*. Correspondingly, another set of horizontally extending inner electrodes (referred to as the second electrodes) 156, 157 and 158 are formed respectively at the heights of the first electrodes 153, 154 and 155 inside the sintered ceramic body 152 so as to be exposed to the exterior on the second end surface 152*b*, the electrodes 153 and 156 forming a pair, the electrodes 154 and 157 forming another pair, and the electrodes 155 and 158 forming still another pair. Each pair of first and second electrode is in a coplanar relationship and separated by a gap of a same specified width and is designed such that the gaps between these three pairs of inner electrodes overlap in the vertical direction, that is, the direction of the thickness of the sintered ceramic body 152.

The resistance of the thermistor element 151 thus structured is adjustable to a desired value by varying the size of the gap between the aforementioned first and second inner electrodes as well as the number of pairs of first and second inner electrodes. In order to accurately set the resistance value of the thermistor element 151, therefore, it is necessary not only to highly accurately set the gap between the first and second inner electrodes of each pair but also to form each inner electrode 153–158 such that the gaps therebetween are all accurately positioned in the direction of the thickness of the sintered ceramic body 152. In other words, strict process management was indispensable for the production of chip-type thermistor elements having a desired resistance value.

When chip-type thermistor elements having different resistance values are desired, either the gap between the first inner electrodes 153–155 and the second inner electrodes 156–158 or the number of layered pairs of inner electrodes must be changed. If the width of the gaps is to be changed, however, a different electrode pattern must be prepared and printed on ceramic green sheets with a conductive paste in order to obtain sintered ceramic bodies by the conventional integral sintering technology. Since the accuracy involved in the printing of conductive paste cannot be improved beyond a certain limit, variations in the resistance values of the thermistor elements thus obtained are significantly large, and the center of distribution of these resistance values tends to be significantly far away from the desired value. In other words, the yield of acceptable products is not sufficiently high, if it is desired to produce resistor elements with resistance values having only small variations.

Because the gap size and the accuracy in overlapping layers must be strictly controlled if a desired resistance value is to be accurately attained, as explained above, it becomes very expensive to produce chip-type thermistors with many different resistance values. Problems of this kind have been in existence not only with thermistor elements but also with varistors and fixed resistors with a similar inner electrode structure.

SUMMARY OF THE INVENTION

It is therefore an object of this invention to provide resistor elements having mutually oppositely facing pairs of inner electrodes in a layered structure which can be produced accurately with different resistance values by using only a small number of inner electrode patterns.

A resistor element according to a first embodiment of the invention, by which the above and other objects can be accomplished, may be characterized as comprising a ceramic body having a first end surface and a second end surface which are facing away from each other, a first outer electrode on the first end surface and a second outer electrode on the second end surface and a plurality of mutually oppositely facing pairs of inner electrodes inside the ceramic body. Each of these pairs has a first inner electrode extending horizontally from the first end surface towards the second end surface and a second inner electrode extending horizontally from the second end surface towards the first end surface and having a front end opposite and separated from the first inner electrode by a gap of a specified width, these plurality of pairs forming layers in a vertical direction. The gap of at least one of these plurality of pairs of inner electrodes is horizontally displaced from but overlapping with the gaps between the other pairs of inner electrodes. Such a resistor element is produced according to this invention by first setting a distance of displacement according to a target resistance value intended to be had by the resistor elements and then displacing the gap of at least one of the plurality of pairs of inner electrodes horizontally by this distance of displacement.

Resistor elements according to a second embodiment of the invention are similar to those according to the first embodiment of the invention except the thickness of those portions of the ceramic body between at least one of mutually adjacent pairs of the inner electrodes is different from the thickness of the portions of the ceramic body between the other mutually adjacent pairs of the inner electrodes. Such a resistor element can be produced by first obtaining a layered structure by vertically stacking a plurality of mutually oppositely facing pairs of horizontally extending inner electrodes each consisting of a first electrode and a second electrode having oppositely facing front parts with selected numbers of ceramic green sheets inserted between mutually vertically adjacent pairs of the inner electrodes, the selected numbers being determined according to a target resistance value intended to be had by the resistor element, then subjecting the layered structure to a firing process to thereby obtain a resistor body having a first end surface and a second end surface which face away from each other, and next forming a first outer electrode on the first end surface and a second outer electrode on the second end surface.

Resistor elements according to this invention are advantageous not only because their resistance values can be finely adjusted by simple steps but also because those having different resistance values can be manufactured with a small number of patterns for printing electrode patterns on ceramic green sheets.

BRIEF DESCRIPTION OF THE DRAWINGS

The accompanying drawings, which are incorporated in and form a part of this specification, illustrate embodiments of the invention and, together with the description, serve to explain the principles of the invention. In the drawings.

Throughout herein, same or similar components are sometimes indicated by the same numerals for convenience and are not necessarily described or exed repetitiously even where they are components of different resistor elements.

DETAILED DESCRIPTION OF THE INVENTION

Figure 1:
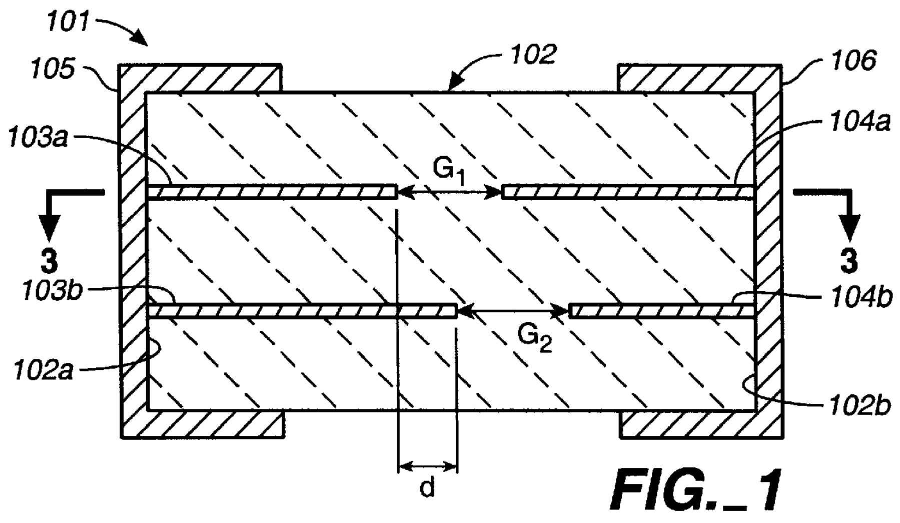
FIG. 1 is a frontal sectional view of a chip-type thermistor element embodying this invention.
Figure 2:
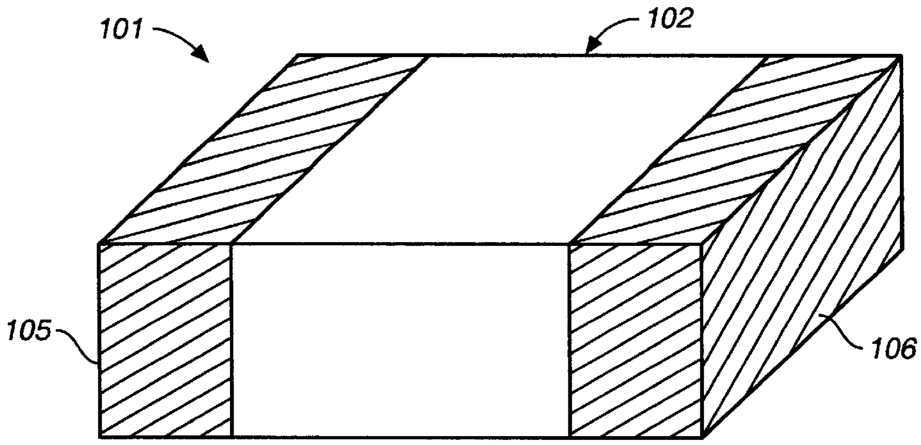
FIG. 2 is a diagonal external view of the thermistor element of FIG. 1.
Figure 3:
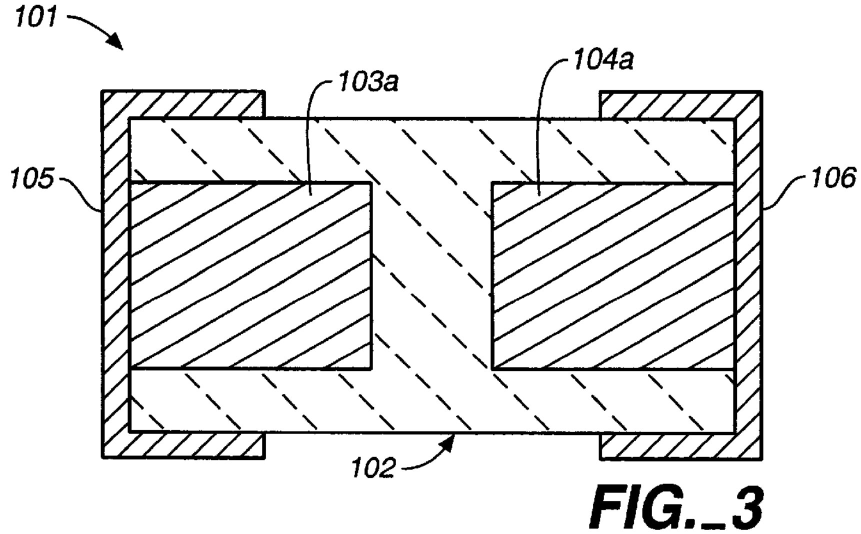
FIG. 3 is a sectional plan view of the thermistor element of FIG. 1 taken along line 3—3 of FIG. 1.

The invention is described first by way of an example with reference to FIGS. 1–3 which show a chip-type thermistor element 101 with a negative temperature coefficient (NTC) as an example of resistor element embodying this invention. This chip-type NTC thermistor element 101 is characterized as being formed with a sintered ceramic body 102 comprising a semiconductor ceramic material with a negative temperature characteristic. This sintered ceramic body 102 is of a rectangular planar shape, having mutually opposite externally facing end surfaces 102*a* (referred to as the first end surface) and 102*b* (referred to as the second end surface).

Formed inside the sintered ceramic body 102 are horizontally extending first inner electrodes 103*a* and 103*b* and second inner electrodes 104*a* and 104*b*. First inner electrode 103*a* and second inner electrode 104*a*, which are together considered to form a pair of mutually oppositely facing electrodes with a gap $G_1$ therebetween, are on a same plane, and first inner electrode 103*b* and second inner electrode 104*b*, which are together considered to form another pair of mutually oppositely facing electrodes with a gap $G_2$ therebetween, are on another plane at a different vertical height. The two first electrodes 103*a* and 103*b* extend to the first end surface 102*a* of the sintered ceramic body 102, and the two second electrodes 104*a* and 104*b* are exposed to the exterior on the second end surface 102*b* of the sintered ceramic body 102. All these inner electrodes 103*a*–104*b* may comprise a suitable metal or alloy such as Ag and Ag—Pd.

Outer electrodes 105 and 106 (herein referred to respectively as the first outer electrode and the second outer electrode) are formed respectively on the first end surface 102*a* and the second end surface 102*b* of the sintered ceramic body 102. These outer electrodes 105 and 106 may be formed by coating a conductive material such as a silver paste and subjecting it to a firing process or by any other suitable method such as plating, vapor deposition and sputtering. They may also have a layered structure with a plurality of conductive layers, being formed, for example, by first coating a silver paste and subjecting it to a burning process, next plating a Ni layer for preventing solder erosion of silver and then forming a Sn layer by plating in order to improve solderability. The outer electrodes 105 and 106 are preferably formed not only on the end surfaces 102*a* and 102*b* but also over portions of the upper, lower and both side surfaces of the sintered ceramic body 102, as shown, for making it easier to surface-mount it, say, onto a printed circuit board.

An important distinguishing characteristic of the thermistor element 1 according to this invention is that gap $G_1$ between the inner electrodes 103*a* and 104*a* and the gap $G_2$ between the inner electrodes 103*b* and 104*b* are of the same width but are formed so as to be mutually displaced in the horizontal direction. The distance by which these two gaps G1 and G2 are displaced with respect to each other in the horizontal direction connecting the two end surfaces 102*a* and 102*b* of the sintered ceramic body 102 is indicated by symbol d (>0) in FIG. 1. Thus, the resistance value of the thermistor element 1 between its two outer electrodes 105 and 106 is not only determined by the width of the gaps $G_1$ and $G_2$ but also variable by changing the magnitude of the displacement distance d.

By comparison, the prior art thermistor chip 151 described above has its gaps arranged such that they overlap accurately in the vertical direction. Thus, the width of the gaps and/or the number of pairs of inner electrode had to be changed if thermistor elements with different resistance values were to be obtained. According to the present invention, by contrast, one has only to change the relative position of the gaps $G_1$ and $G_2$, or to change the displacement d therebetween. Moreover, since the displacement d can be varied by small amounts, or even continuously, the resistance value of the thermistor element 101 according to this invention can be varied also nearly continuously.

The thermistor element 101 of FIGS. 1–3 can be produced by the known integral sintering technology for making layered ceramic structures. This is usually done by stacking a ceramic green sheet with the inner electrodes 103*a* and 104*a* printed on its upper surface and another ceramic green sheet with the inner electrodes 103*b* and 104*b* printed on its upper surface together with other ceramic green sheets. Since the gaps $G_1$ and $G_2$ are the same as far as their widths are concerned, a same electrode pattern may be used to print the inner electrodes 103*a* and 104*a* and the inner electrodes 103*b* and 104*b*. In other words, the inner electrodes 103*a*–104*b* can be appropriately arranged by forming two green sheets with a same electrode pattern with a gap of a unique width and stacking them by appropriately displacing one of them with respect to the other so as to have a desired displacement d between the two gaps $G_1$ and $G_2$ in the horizontal direction. In summary, chip-type NTC thermistor elements with different resistance values can be obtained easily according to this invention without increasing the number of electrode patterns for forming inner electrodes.

The invention is described next by way of actual experiments for testing its effects. For this purpose, ceramic green sheets of thickness 50 $\mu$m were first obtained by using a ceramic slurry containing ceramic powders with negative temperature characteristics comprising oxides of a plurality of transition metals such as Mn, Ni and Co. These ceramic green sheets were cut into a specified rectangular shape to obtain so-called mother sheets. A plurality of pairs of mutually oppositely facing first and second inner electrodes were formed in a matrix formation on the upper surface of these mother green sheets such that their gaps are as given in Table 1 shown below. The pattern for the inner electrodes was made by screen printing of a silver paste.

Thereafter, these mother ceramic green sheets with inner electrode patterns printed thereon were stacked such that the displacement d of the gaps would be as given also in Table 1. Plain mother ceramic green sheets with nothing printed thereon were stacked further thereon, and the stacked assembly was pressed in the direction of the thickness to obtain a layered object of mothers. This layered object was cut in the direction of the thickness to obtain individual chips of the size of individual NTC thermistor element 101. These chips were subjected to a firing process to obtain sintered ceramic bodies 102. Thereafter, a silver paste was applied to the end surfaces 102*a* and 102*b* of each sintered ceramic body 102 and outer electrodes 105 and 106 were formed by a firing process.

Resistance values $R_{25}$ at 25° C. of these chip-type NTC thermistor elements thus obtained were measured. The results are also shown in Table 1 below.

TABLE 1

| Gap width (mm) | Displacement d (mm) | Resistance $R_{25}$ (kΩ) |
|---|---|---|
| 0.35 | 0.00 | 1.087 |
| | 0.05 | 1.083 |
| | 0.10 | 1.066 |
| | 0.15 | 1.040 |
| | 0.20 | 0.995 |
| | 0.25 | 0.941 |
| | 0.30 | 0.882 |
| 0.25 | 0.00 | 0.974 |
| | 0.05 | 0.972 |
| | 0.10 | 0.965 |
| | 0.15 | 0.953 |
| | 0.20 | 0.938 |

Figure 4:
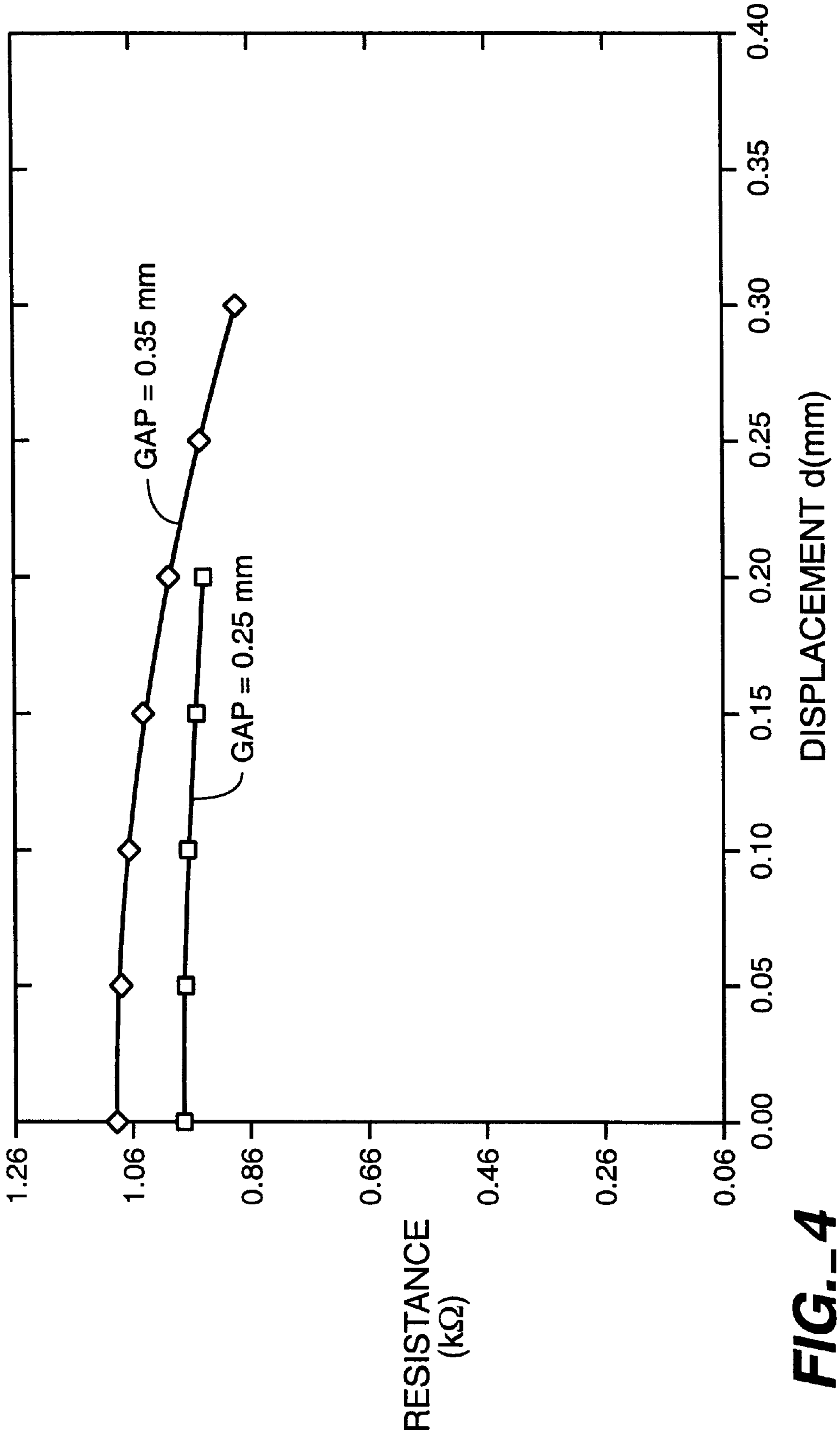
FIG. 4 is a graph showing the relationship between the displacement of gaps between inner electrodes and the resistance value.

The relationship between the displacement d and the resistance value $R_{25}$ given above is also shown in FIG. 4. Both Table 1 and FIG. 4 clearly show that the resistance value of the chip-type NTC thermistor element 1 can be changed gradually and by a very small amount by changing the distance of displacement d in units of 0.05 mm whether the width of the gaps $G_1$ and $G_2$ is 0.35 mm or 0.25 mm. In this experiment, the distance of displacement d was changed only within limits which are smaller than the width of the gaps $G_1$ and $G_2$ because if the displacement d is made larger and the inner electrodes 103*b* and 104*a* begin to overlap each other in the vertical direction, the resistance therebetween becomes small suddenly.

Figure 5:
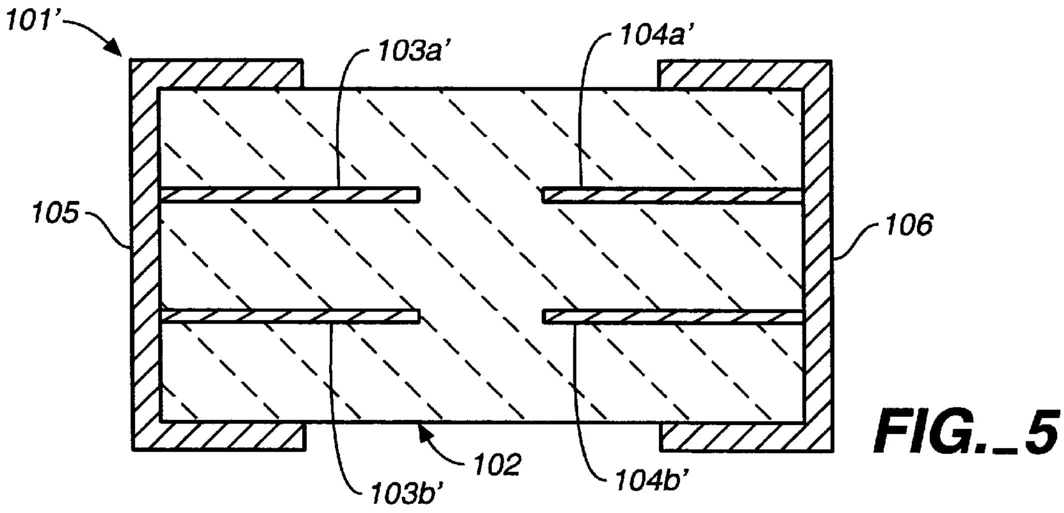
FIG. 5 is a frontal sectional view of another chip-type thermistor element prepared for the purpose of comparison.

As a comparison experiment, chip-type NTC thermistor elements of various specifications were prepared as shown at 101' in FIG. 5 (with their inner electrodes indicated by 103*a'*, 103*b'*, 104*a'* and 104*b'*) by removing the displacement (or d=0) and changing only the width of the gaps $G_1$ and $G_2$ from 0.20 mm to 0.35 mm. The results of measurement of their resistance values $R_{25}$ (at 25° C.) are shown in Table 2.

TABLE 2

| Gap width (mm) | Resistance $R_{25}$ (kΩ) |
|---|---|
| 0.20 | 0.914 |
| 0.25 | 0.974 |
| 0.30 | 1.034 |
| 0.35 | 1.087 |

Table 2 shows that the resistance value of the chip-type NTC thermistor elements 101' of the kind shown in FIG. 5 can be changed from 0.914 kΩ to 1.087 kΩ by changing the width of the gaps $G_1$ and $G_2$ in units of 0.5 mm. It also shows, however, that the resistance value changes by as much as about 0.06 kΩ as the gap width is changed by 0.05 mm. This means that the gap width must be changed by a smaller amount if a finer adjustment of the resistance value is desired. As explained above, however, the gap width cannot be accurately controlled when an inner electrode pattern is formed by a screen printing method. The smallest amount by which the gap width can be controlled is only about 0.025 mm. In other words, with a chip-type NTC thermistor element of the kind shown in FIG. 5 for comparison, the resistance value can be accurately controlled only by about 0.03 kΩ. Table 1 shows, by contrast, that the resistance value can be controlled by about 0.004 kΩ, if the gap width is 0.35 mm, and by about 0.002 kΩ, if the gap width is 0.25 mm, by changing the displacement distance d by 0.05 mm in the case of a chip-type NTC thermistor element embodying this invention.

As the displacement distance d is made larger, the resistance value becomes smaller. This is because the direct distance between the inner electrodes 103*b* and 104*a* at different heights becomes smaller as the displacement distance d is made larger. It should thus be clear that a desired resistance value can be easily obtained by adjusting the displacement distance d.

Figure 6:
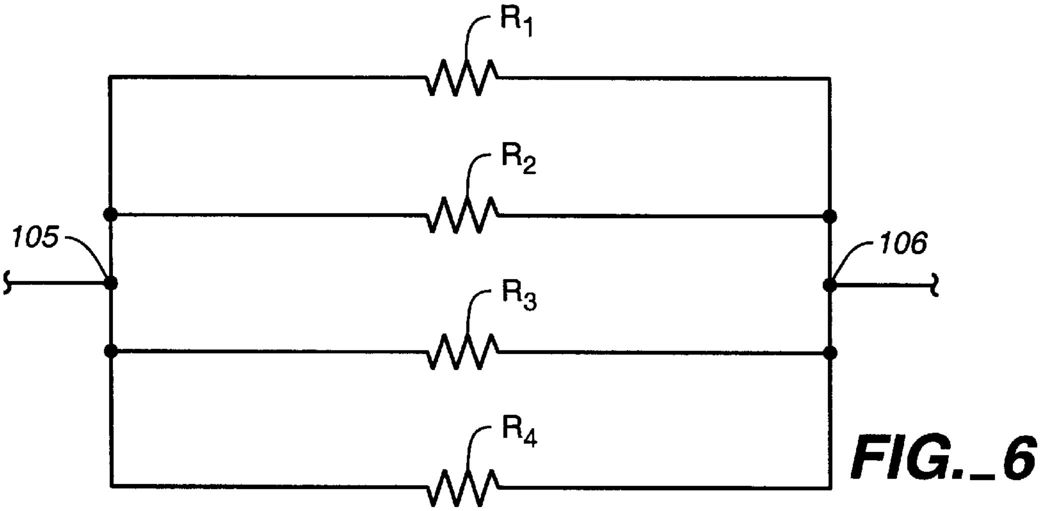
FIG. 6 is a circuit diagram for showing the circuit structure of the thermistor element of FIG. 1.

This advantageous effect of the present invention can be explained also by way of the equivalent circuit diagram shown in FIG. 6 wherein $R_1$ indicates the resistance between inner electrodes 103*a* and 104*a*, $R_2$ indicates the resistance between inner electrodes 103*b* and 104*b*, $R_3$ indicates the resistance between inner electrodes 103*b* and 104*a*, $R_4$ indicates the resistance between inner electrodes 103*a* and 104*b*, these resistances $R_1$, $R_2$, $R_3$ and $R_4$ being connected in parallel between the two outer electrodes 105 and 106. If the gap $G_2$ is moved then to the right with respect to the gap $G_1$ with reference to FIG. 1, that is, if the displacement distance d is increased from zero to a positive value, resistances $R_1$ and $R_2$ as defined above will not change but resistance $R_3$ becomes smaller and resistance $R_4$ becomes larger such that the net resistance of this parallel connection shown in FIG. 6 becomes lower.

Although the invention was described above with reference to only one example, this example is not intended to limit the scope of the invention. The upper pair of mutually oppositely facing first and second inner electrodes 103*a* and 104*a*, for example, were said to be in a coplanar relationship but this is not a requirement. Each pair of mutually oppositely facing first and second inner electrodes may be at different heights. The number of these pairs also is not intended to limit the scope of the invention. When there are three or more pairs, the invention does not impose any limitation as to the number of pairs of which the gap between the first and second inner electrodes is to be displaced. It also goes without saying that the present invention is applicable to other kinds of resistor elements such as PTC thermistor elements, varistors and ordinary fixed resistors with a layered structure.

Figure 7:
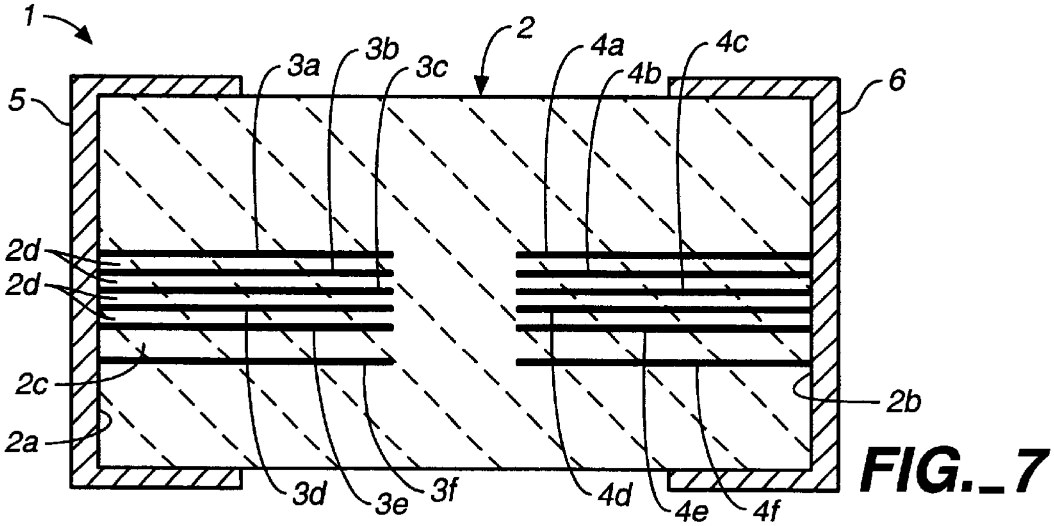
FIG. 7 is a frontal sectional view of still another thermistor element according to a second embodiment of this invention.

FIG. 7 shows another thermistor element 1 as another example of resistor element according to another (second) embodiment of this invention. This thermistor element 1, too, is formed with a ceramic body 2 comprising a semiconductor ceramic material with a negative temperature characteristic, having a rectangular planar shape with mutually opposite end surfaces 2*a* (referred to as the first end surface) and 2*b* (referred to as the second end surface).

Formed inside the ceramic body 2 are horizontally extending first inner electrodes 3*a*, 3*b*, 3*c*, 3*d*, 3*e* and 3*f* (3*a*–3*f*) of the same lengths and second inner electrodes 4*a*, 4*b*, 4*c*, 4*d*, 4*e* and 4*f* (4*a*–4*f*) of the same lengths. The first inner electrode 3*a*–3*f* are formed at mutually different heights, and each of the second inner electrode 4*a*–4*f* is in coplanar relationship and forms a mutually oppositely facing pair with a corresponding one of the first inner electrodes 3*a*–3*f* with a gap of a specified width therebetween. In other words, there are six pairs of mutually opposite inner electrodes and the gaps therebetween exactly overlapping in the vertical direction.

Outer electrodes 5 and 6 (herein referred to respectively as the first outer electrode and the second outer electrode) are formed respectively on the first end surface 2*a* and the second end surface 2*b* of the ceramic body 2. The first outer electrode 5 is connected to each of the first inner electrodes 3*a*–3*f*, and the second outer electrode 6 is connected to each of the second inner electrodes 4*a*–4*f*. As explained above with reference to the first embodiment of this invention, the outer electrodes 5 and 6, too, are preferably formed not only on the end surfaces 2*a* and 2*b* but also over portions of the upper, lower and both side surfaces of the ceramic body 2, as shown in FIG. 2, for making it easier to surface-mount it, say, onto a printed circuit board.

The inner electrodes 3*a*–3*f* and 4*a*–4*f* may comprise a suitable metal or alloy such as Ag, Cu, Ni and Ag—Pd. The outer electrodes 5 and 6 may be formed similarly as explained above for the outer electrodes 105 and 106.

The thermistor element 1 according to this invention is distinguishably characterized in that the thickness of the portions 2*d* of the ceramic body 2 between vertically adjacent pairs of the top five of the first and second electrodes 3*a*–3*e* and 4*a*–4*e* is less than that of the portions 2*c* of the ceramic body 2 between the bottom two of the first and second electrodes 3*e*–3*f* and 4*e*–4*f*. In other words, the resistance value of the thermistor element 1 according to this embodiment of the invention is adapted to be adjusted by changing not only the number of pairs of mutually oppositely facing first and second inner electrodes and the width of the gap between these pairs of first and second inner electrodes but also the thickness values of the layered portions 2*c* and 2*d* of the ceramic body 2.

As explained above, the width of the gaps and the number of pairs of first and second inner electrodes are preliminarily determined. Since the widths and positions of the gaps cannot be made exactly uniform because of the limitation in accuracy when the inner electrodes are printed on ceramic green sheets, significant variations occur inevitably among the resistance values of produced thermistor elements. According to this embodiment of the invention, however, the resistance value can be adjusted even after the inner electrodes 3*a*–3*f* and 4*a*–4*f* are printed on ceramic green sheets with insufficient accuracy, say, by varying the thickness of the layer portions 2*c* of the ceramic body 2. The adjustment of the thickness of the layer portions 2*c* can be effected easily by increasing or decreasing the number of plain ceramic green sheets (with no electrodes printed thereon) inserted between the sheet on which inner electrodes 3*e* and 4*e* are printed and the sheet on which inner electrodes 3*f* and 4*f* are printed. As a practical example, if the accuracy in printing is not sufficient and the center of distribution of the resistance values for produced thermistor elements is greater than the desired resistance value, the thickness of the layer portions 2*c* is increased (or made greater than the thickness of the other layer portions 2*d*, if the pairs of inner electrodes were originally spaced equally) so as to reduce the resistance values. It now goes without saying that thermistor elements with various resistance values can thus be produced easily according to this embodiment of the invention.

The second embodiment of the invention is further explained next by describing thermistor elements with different designs as well as production processes actually carried out for obtaining them.

Figure 8A:
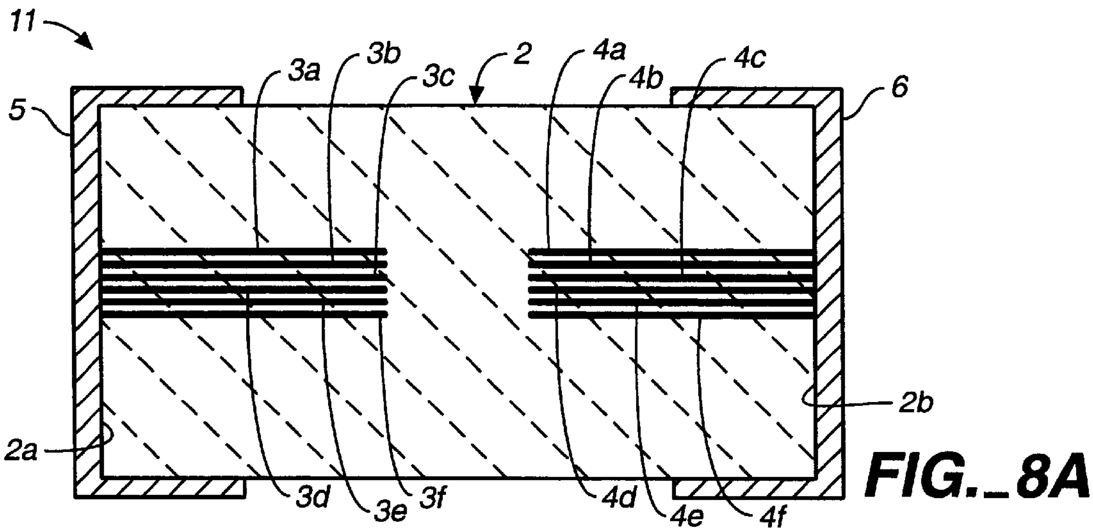
FIGS. 8A, 8B and 8C are frontal sectional views of thermistor elements for showing effects of different layer structures of their inner electrodes.

To start, a ceramic slurry was obtained by mixing an organic binder, a dispersant, an anti-foaming agent and water to semiconductor ceramic powder comprising several oxides such as those of Mn, Ni and Co. This slurry was used to form ceramic green sheets with thickness 50 $\mu$m. Mother ceramic green sheets having a rectangular shape and specified dimensions were punched out of these ceramic green sheets, and inner electrodes 3*a*–3*f* and 4*a*–4*f* were formed by printing with a conductive paste on their upper surfaces. Next, six of these sheets with inner electrodes printed thereon were stacked directly one on top of another (without inserting any plain green sheets in between). Appropriate numbers of plain green sheets with no electrodes printed thereon were then placed both at the top and at the bottom of this pile to make a layered structure, and this layered structure was fired to obtain a thermistor block. Next, outer electrodes 5 and 6 were formed on the end surfaces of this thermistor block by coating with a silver-containing conductive paste and subjecting it to a firing process to obtain a thermistor element 11 shown in FIG. 8A. The layer structure of this thermistor element 11 will be expressed as {00000}, indicating that each of the five intervals between mutually adjacent pairs (in the direction of the thickness) of these six piled-up green sheets having inner electrodes printed thereon has no (=zero) plain green sheet inserted therein.

Figure 8B:
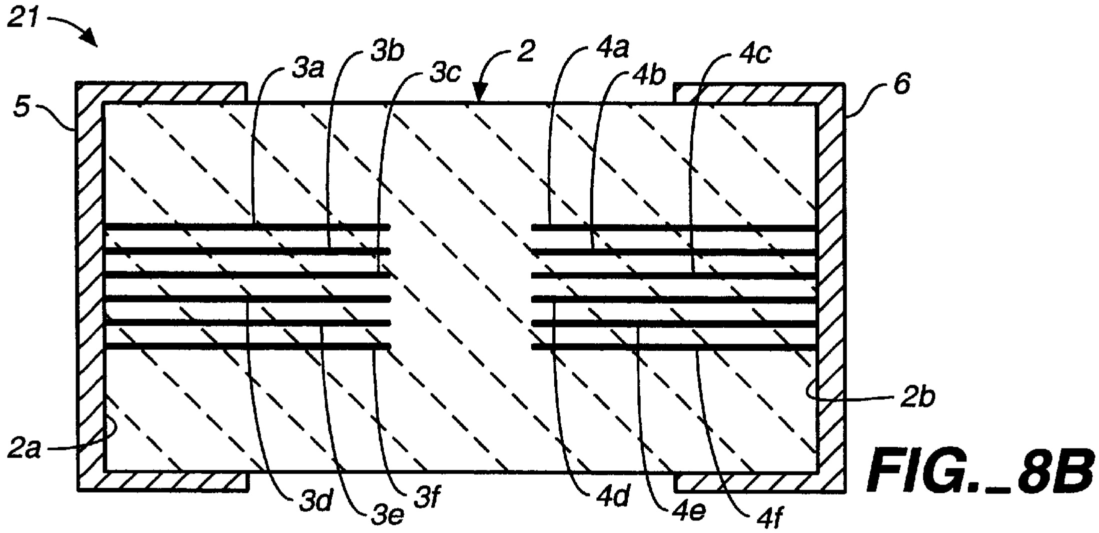
Figure 8C:
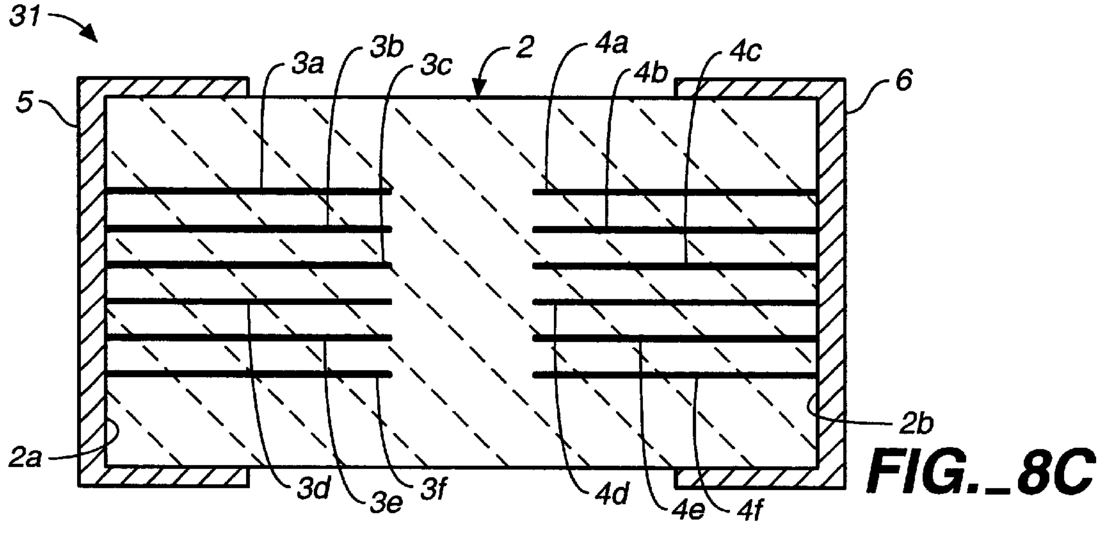
Figure 9A:
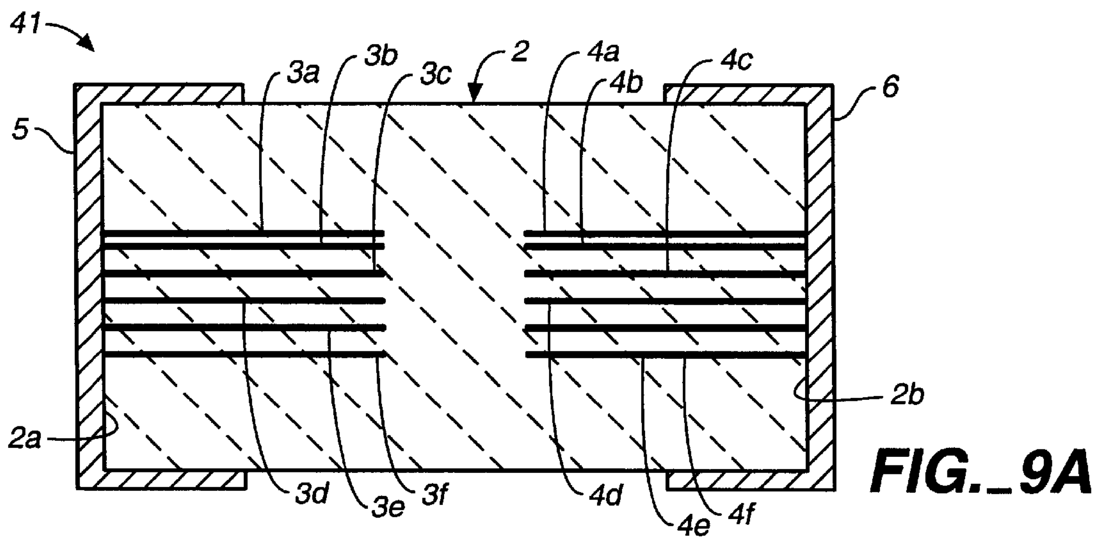
FIGS. 9A, 9B, 9C and 9D are frontal sectional views of other thermistor elements with inner electrodes separated at unequal intervals.
Figure 9B:
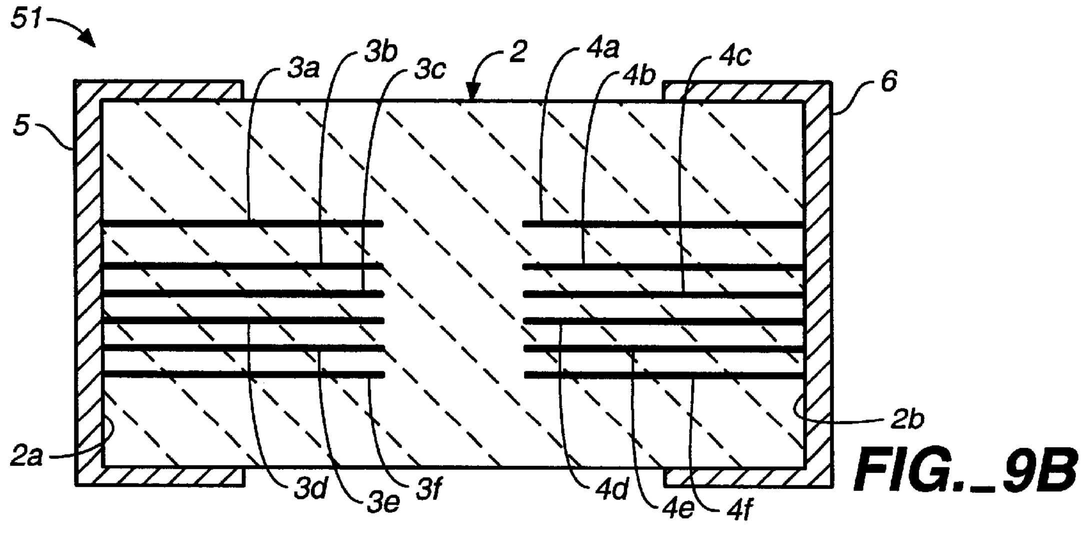
Figure 9C:
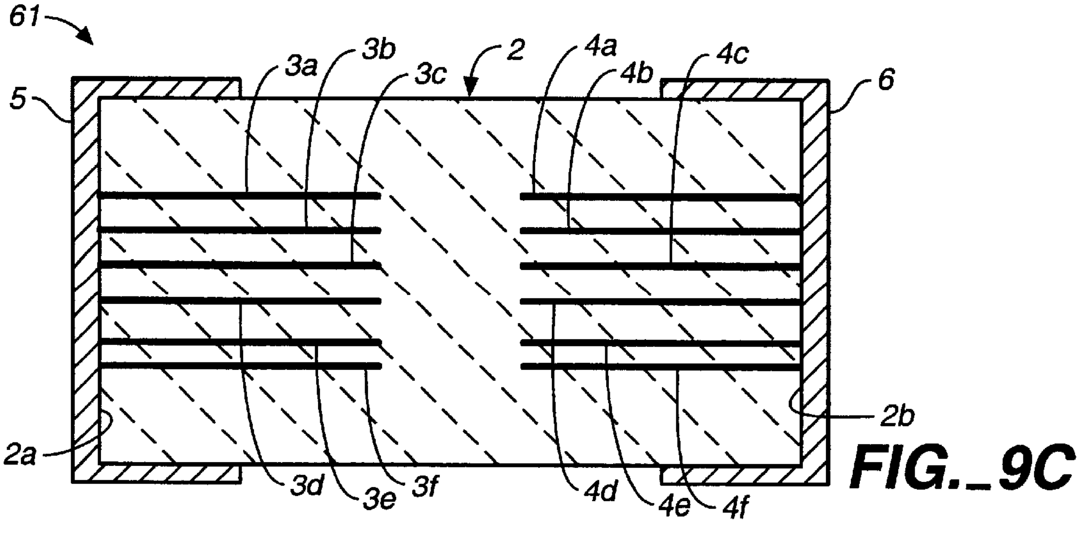
Figure 9D:
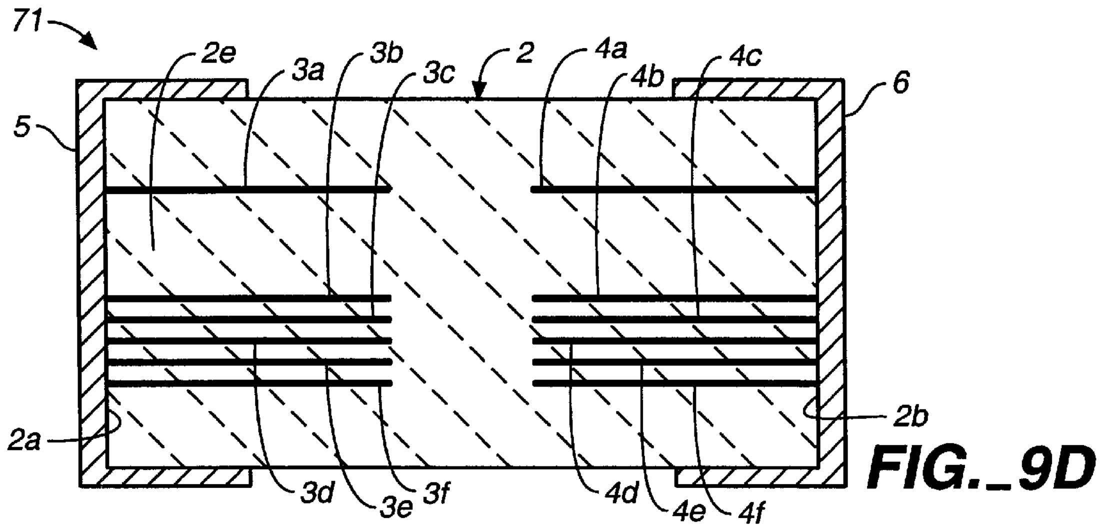
Figure 10:
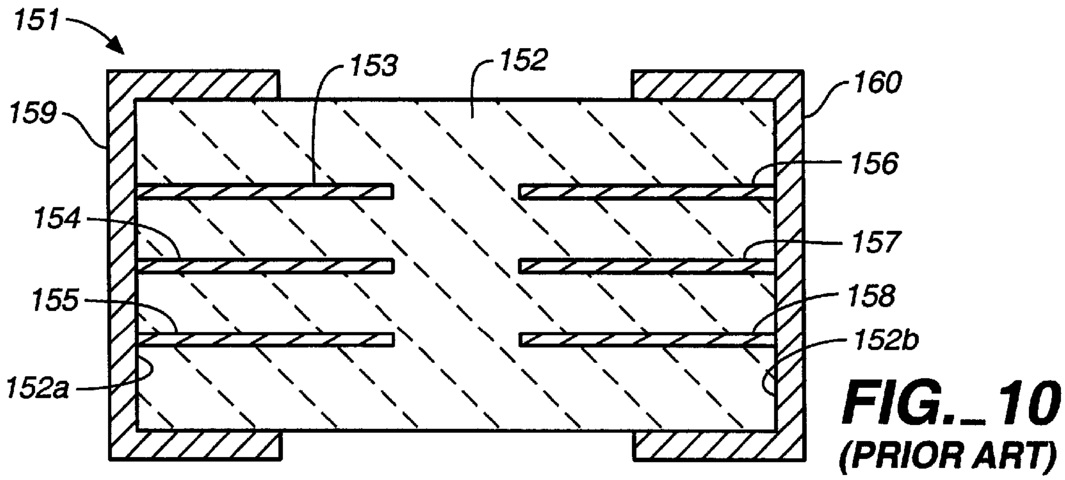
FIG. 10 (PRIOR ART)
FIG. 10 is a frontal sectional view of a prior art chip-type thermistor element.
Figure 11:
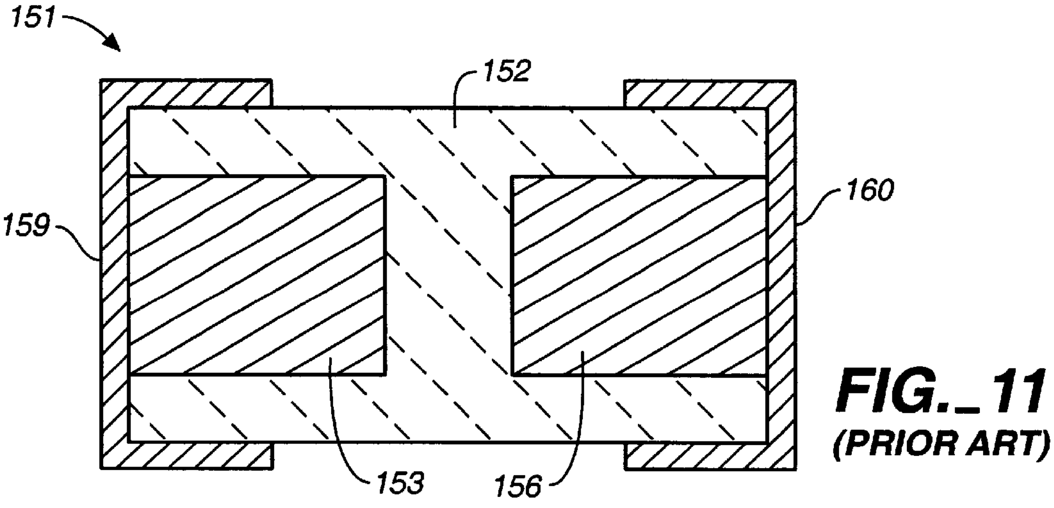
FIG. 11 (PRIOR ART)
FIG. 11 is a sectional plan view of the prior art chip-type thermistor element of FIG. 10.

Similarly, another thermistor element 21 shown in FIG. 8B was obtained by a process identical to that for the production of the thermistor element 11 except a plain green sheet was inserted in each of the five intervals between mutually adjacent pairs of the six electrode-carrying green sheets. The layer structure of this thermistor element is therefore expressed as {11111}. Still another thermistor element 31 shown in FIG. 8C was obtained by a process identical to the above except two plain green sheets were inserted in each of these five intervals. The layer structure of this thermistor element 31 is expressed as {22222} for the same reason.

FIGS. 9A, 9B, 9C and 9D show thermistor elements 41, 51, 61 and 71, respectively, produced in identical manners as described above except by varying the numbers of plain green sheets to be inserted to the five intervals provided by the six sequentially stacked electrode-carrying green sheets. The layer structures of these thermistor elements 41, 51, 61 and 71, expressed according to the formalism introduced above, are respectively {01111}, {21111}, {22221} and {41111}. Although not individually illustrated, additional thermistor elements with still other layer structures as shown in Table 3 were produced. The measured resistance values $R_{25}$ (at 25° C.) of all these thermistor elements are also shown in Table 3.

TABLE 3

| Layer structure | Resistance value $R_{25}$ (kΩ) |
|---|---|
| 11111 | 10.694 |
| 01111 | 11.023 |
| 00000 | 11.763 |
| 21111 | 10.206 |
| 22222 | 9.540 |
| 41111 | 9.852 |
| 31111 | 10.082 |

By comparing the thermistor elements 11, 21 and 31 with uniform layer structures {00000}, {11111} and {22222} in Table 3, it can be seen that the resistance value becomes higher as the thickness of the layered portions of the ceramic body 2 between vertically adjacent pairs of inner electrodes 3*a*–3*f* and 4*a*–4*f* becomes smaller. It is also noted by comparing the other thermistor elements with layered portions of the ceramic body 2 having unequal thicknesses with the thermistor elements 11, 21 and 33 that it is possible to change the resistance value by changing the thickness of only one of the intervals between vertically adjacent inner electrodes.

When thermistor elements with a certain desired resistance values are to be mass-produced, for example, let us assume that sample thermistor elements with layer structure {11111} have been produced as described above but the center of distribution of their measured resistance values was found to be greater than the desired target value. In such a case, in order to reduce the resistance value, the layer structure may be modified to {21111} or even {41111} by increasing the thickness of the layer portions of the ceramic body 2 between one of the vertically adjacent pairs of inner electrodes. This may be accomplished, as described above, by inserting one or more additional plain green ceramic sheets between the pair of inner electrodes between which the separation is to be increased.

Similarly, if the center of distribution of the resistance values of sample thermistor elements was smaller than the desired target value, the thickness of the layer portions of the ceramic body 2 between one of vertically adjacent pairs of inner electrodes is reduced by reducing the number of plain green sheets therebetween.

In summary, adjustments can be made not only on the gap in the horizontal direction between a mutually corresponding pair of first and second inner electrodes but also on the thickness of the portions of the ceramic body between one of vertically adjacent pairs of first and second inner electrodes such that the resistance value can be corrected easily even after inner electrodes have been printed on ceramic green sheets.

Although the second embodiment of the invention was described above with reference to only a limited number of examples, they are not intended to limit the scope of the invention. Many modifications and variations are possible within the scope of this invention, as explained above regarding the first embodiment of the invention described with reference to FIGS. 1–3. It is to be noted in particular that expressions such as "horizontal", "vertical" and "height" are used throughout herein for the sake of convenience of description and only for explaining the relative orientation of various components. Thus, the expression "horizontal" is intended to be interpreted as indicating a certain direction, the expression "vertical" as the direction perpendicular thereto, and the expression "height" as the distance in the "vertical" direction thus defined.

What is claimed is:

1. A resistor element comprising:

a ceramic body having a first end surface and a second end surface which are facing away from each other;

a first outer electrode on said first end surface and a second outer electrode on said second end surface; and a plurality of mutually oppositely facing pairs of inner electrodes inside said ceramic body, each of said pairs having a first inner electrode extending horizontally from said first end surface towards said second end surface and a second inner electrode extending horizontally from said second end surface towards said first end surface and having a front end opposite and separated from said first inner electrode, said plurality of pairs forming layers in a vertical direction, thickness of portions of the ceramic body between at least one of mutually adjacent pairs of the inner electrodes being different from thickness of portions of the ceramic body between the other mutually adjacent pairs of the inner electrodes.

2. The resistor element of claim 1 wherein thickness of portions of the ceramic body between only one of the mutually adjacent pairs of the inner electrodes being different from thickness of portions of the ceramic body between the other mutually adjacent pairs of the inner electrodes.

* * * * *